United States Patent [19]

Sato

[11] Patent Number: 5,284,799
[45] Date of Patent: Feb. 8, 1994

[54] METHOD OF MAKING A METAL PLUG

[75] Inventor: Junichi Sato, Tokyo, Japan

[73] Assignee: Sony Corporation, Tokyo, Japan

[21] Appl. No.: 858,653

[22] Filed: Mar. 27, 1992

[30] Foreign Application Priority Data

Mar. 27, 1991 [JP] Japan .................................. 3-63463

[51] Int. Cl.$^5$ ............................................ H01L 21/283
[52] U.S. Cl. ...................................... 437/189; 437/190;
437/195; 437/947; 748/DIG. 20
[58] Field of Search ............... 437/190, 192, 195, 228,
437/947, 189; 257/752, 753, 758, 763;
748/DIG. 20

[56] References Cited

U.S. PATENT DOCUMENTS

| 4,753,709 | 6/1988 | Welch et al. | 156/643 |
| 4,936,950 | 6/1990 | Doan et al. | 156/643 |
| 4,981,550 | 1/1991 | Huttemann et al. | 156/643 |
| 4,987,099 | 1/1991 | Flanner | 437/192 |
| 5,000,818 | 3/1991 | Thomas et al. | 156/643 |
| 5,008,730 | 4/1991 | Huang et al. | 257/763 |
| 5,104,826 | 4/1992 | Fujita et al. | 437/190 |

FOREIGN PATENT DOCUMENTS

| 0200525 | 11/1986 | European Pat. Off. | 437/947 |
| 63-311724 | 12/1988 | Japan | 437/195 |
| 2-143445 | 6/1990 | Japan | 437/192 |

Primary Examiner—T. N. Quach
Attorney, Agent, or Firm—Hill, Steadman & Simpson

[57] ABSTRACT

A metal plug is formed in a connection hole such as a via hole or a contact hole to provide an interconnection between multilayer wires in a semiconductor integrated circuit. First, a connection hole is formed in an insulating film, and an adhesion layer is deposited on the insulating film and in the connection hole. Then, a metal layer is deposited on the adhesion layer, and the metal layer and the adhesion layer are removed, leaving a portion of the metal layer as a metal plug in the connection hole. The metal plug includes a portion left on the insulating film in a size greater than the width of the connection hole. The connection hole may be a stepped connection hole or may have a tapered portion. The metal plug may be composed of first and second metal layers with or without the adhesion layer interposed between.

5 Claims, 11 Drawing Sheets

F I G. 3D
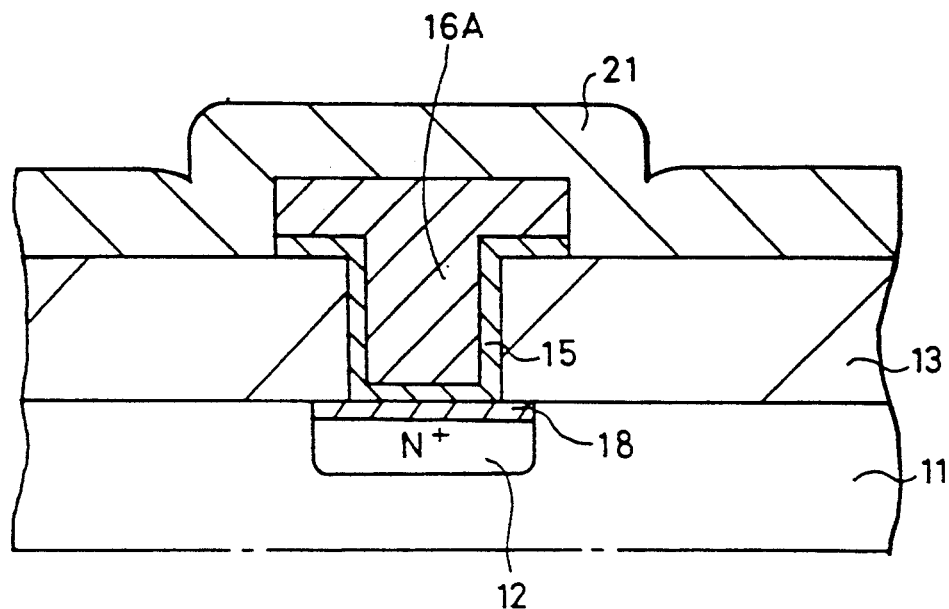
F I G. 3E
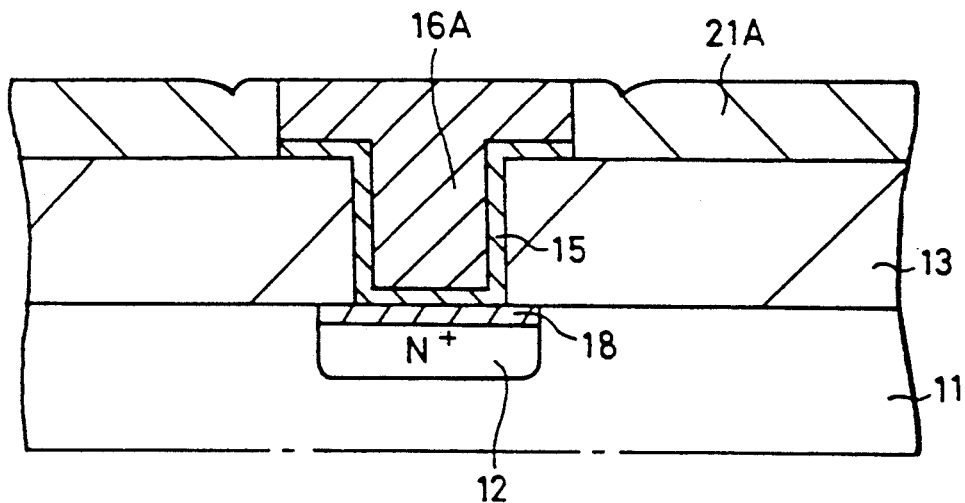

METHOD OF MAKING A METAL PLUG

BACKGROUND OF THE INVENTION

1. Field of the Invention

The present invention relates to a method of making a metal plug, and more particularly to a method of embedding a metal plug or connector of a metal in a via hole, or a plated through hole, which interconnects several layers of multilayer wires on a semiconductor integrated circuit or a contact hole which interconnects a semiconductor substrate and a wire.

2. Description of the Prior Art

Semiconductor integrated circuits such as ULSI circuits are composed of a large number of circuit components and interconnections that are packed in very small size and with very high density. On those integrated circuits, the via holes which provide interconnections between layers of multilayer wires and the contact holes which interconnect semiconductor substrates and wires have diameters that are as small as 0.35 μm. The conventional bias sputtering process for producing interconnections of Al fails to provide good interconnections between those connection holes in terms of step coverage.

Metal plugs have been proposed and put to use in order to improve the step coverage with respect to such interconnections between such small via holes and contact holes. Metal plugs are selectively embedded in via holes and contact holes. One of the metal plugs that has drawn much attention in the art is in the form of a tungsten plug that provides good step coverage and has a lower contact resistance than plugs of polycrystalline silicon.

Heretofore, a tungsten plug may be made according to eigher a selective tungsten CVD process or a blanket tungsten CVD process. The blanket tungsten CVD process is more advantageous than the selective tungsten CVD process because it is stabler and more effective to make metal plugs in connection holes of different depths.

FIGS. 1A through 1C of the accompanying drawings show a conventional method of interconnecting wires with a metal plug.

First, as shown in FIG. 1A, a lower wire 2 is formed as a diffused layer in a silicon substrate 1, and then an insulating film 3 of $SiO_2$, for example, is deposited on the upper surface of the silicon substrate 1. After a connection hole 4 for providing an electric interconnection is formed in the insulating film 3, a film 5 of TiN, for example, is deposited as an adhesion layer on the entire surface of the insulating film 3 including the connection hole 4.

Then, as shown in FIG. 1B, a layer of a refractory metal such as a blanket tungsten layer 6 is deposited on the film 5 by CVD.

Thereafter, as shown in FIG. 1C, the blanket tungsten layer 6 and the film 5 are etched back to leave the tungsten as a metal plug 6A and the film 5 only in the connection hole 4. Then, an upper wire 7 is deposited on the insulating film 3 so as to be connected to the metal plug 6A.

A film 8 of $TiSi_2$ may be deposited as a heat resistant layer on the surface of the diffused lower wire 2 by SITOX (silicidation through oxide).

According to the conventional process, it is necessary to provide the TiN film 5 as an adhesion layer between the CVD blanket tungsten layer 6 and the insulating film 3 for better adhesion therebetween. When the blanket tungsten layer 6 is etched back and also the TiN film 5 is etched, overetching is required to ensure sufficient removal of the materials. However, since the etchant concentrates on the TiN film 5 on the side wall of the connection hole 4, the TiN 5 is considerably overetched as shown in FIG. 2 of the accompanying drawings. Consequently, the upper wire 7 which will subsequently be deposited may not reliably be formed over the metal plug 6A.

OBJECTS AND SUMMARY OF THE INVENTION

In view of the aforesaid drawbacks of the conventional methods of making a metal plug, it is an object of the present invention to provide a method of making a metal plug for semiconductor integrated circuits of small size and high packing density.

According to the present invention, there is provided a method of making a metal plug in a connection hole in an insulating film, comprising the steps of forming a connection hole in an insulating film, depositing an adhesion layer on the insulating film and in the connection hole, depositing a metal layer on the adhesion layer, and etching away the metal layer and the adhesion layer, leaving a portion of the metal layer as a metal plug in the connection hole, the metal plug including a portion left on the insulating film in a size greater than the width of the connection hole.

Since the metal plug includes a portion left on the insulating film in a size greater than the width of the connection hole, the metal layer and the adhesion layer in the connection hole are prevented from overetched.

According to the present invention, there is also provided a method of making a metal plug in a connection hole in an insulating film, comprising the steps of forming a stepped connection hole in an insulating film, the stepped connection hole having an upper portion and a lower portion, the upper portion being wider than the lower portion, depositing an adhesion layer on the insulating film and in the stepped connection hole, depositing a metal layer on the adhesion layer, and etching away the metal layer and the adhesion layer, leaving a portion of the metal layer as a metal plug in the stepped connection hole.

The stepped configuration of the connection hole is effective in stopping any overetching of the adhesion layer in the upper portion of the connection hole, and prevents the adhesion layer in the lower portion thereof from being overetched.

According to the present invention, there is further provided a method of making a metal plug in a connection hole in an insulating film, comprising the steps of forming a connection hole in an insulating film, depositing a first metal layer up to a predetermined level in the connection hole, depositing an adhesion layer on the insulating film and on the first metal layer in the connection hole, depositing a second metal layer on the adhesion layer, and etching away the second metal layer and the adhesion layer, leaving a portion of the second metal layer and the first metal layer as a metal plug in the connection hole.

Since the first metal layer is deposited in the connection hole up to the predetermined level, the problem of step coverage of the adhesion layer and the second metal layer is eliminated.

According to the present invention, there is further provided a method of making a metal plug in a connection hole in an insulating film, comprising the steps of depositing an adhesion layer on an insulating film, forming a connection hole in the adhesion layer and the insulating film, depositing a first metal layer up to a predetermined level in the connection hole, depositing a second metal layer on the adhesion layer and on the first metal layer in the connection hole, and etching away the second metal layer and the adhesion layer, leaving a portion of the second metal layer and the first metal layer as a metal plug in the connection hole.

The first metal layer deposited in the connection hole up to the predetermined level is also effective to avoid the problem of step coverage of the adhesion layer and the second metal layer. In addition, no overetching of the adhesion layer occurs in the connection hole as the adhesion layer is not deposited in the connection hole.

The principles of the present invention are advantageous when employed to make metal plugs in semiconductor integrated circuits such as ULSI circuits which are composed of a large number of circuit components and interconnections that are packed in very small size and with very high density.

The above and other objects, features, and advantages of the present invention will become apparent from the following description of illustrative embodiments thereof to be read in conjunction with the accompanying drawings, in which like reference numerals represent the same or similar objects.

BRIEF DESCRIPTION OF THE DRAWINGS

FIGS. 3A, 3B, 3C, 3D, and 3E are fragmentary cross-sectional views illustrative of a method of making a metal plug according to an embodiment of the present invention;

DETAILED DESCRIPTION OF THE PREFERRED EMBODIMENTS

FIGS. 3A through 4E illustrate a method of making a metal plug according to an embodiment of the present invention.

Figure 1A:
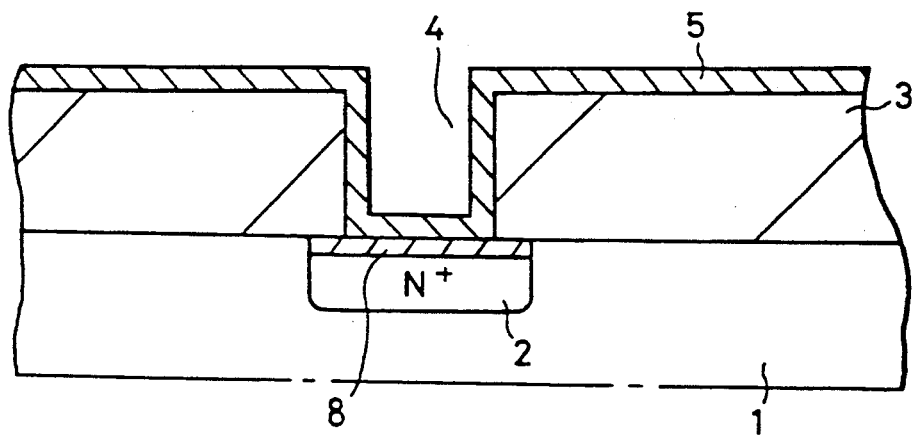
FIGS. 1A, 1B, and 1C are fragmentary cross-sectional views illustrative of a conventional method of making a metal plug.
Figure 1B:
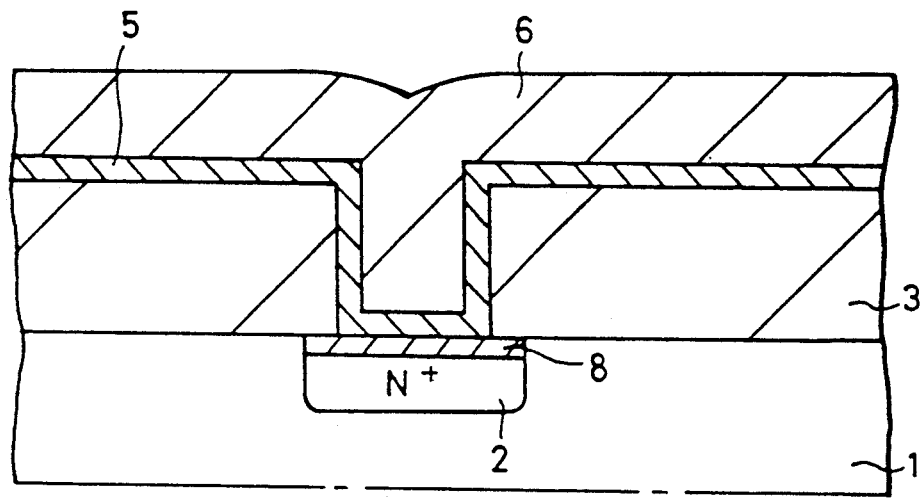
Figure 1C:
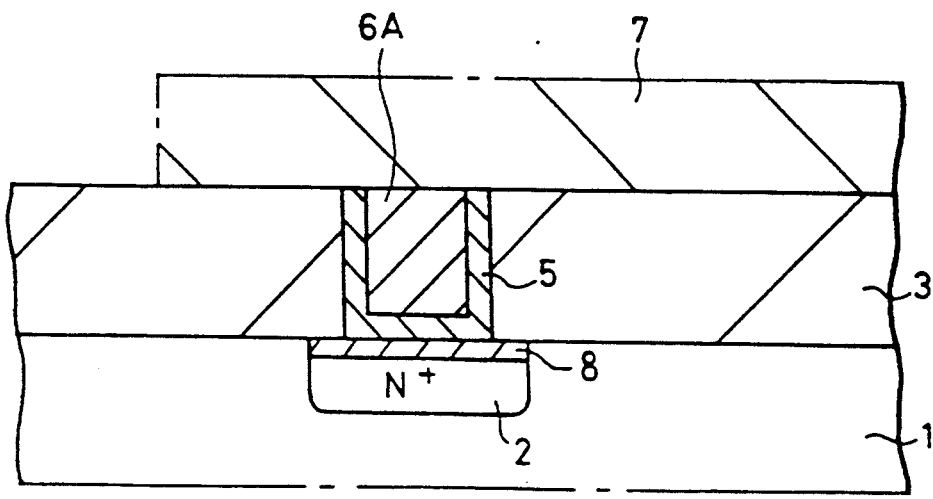
Figure 2:
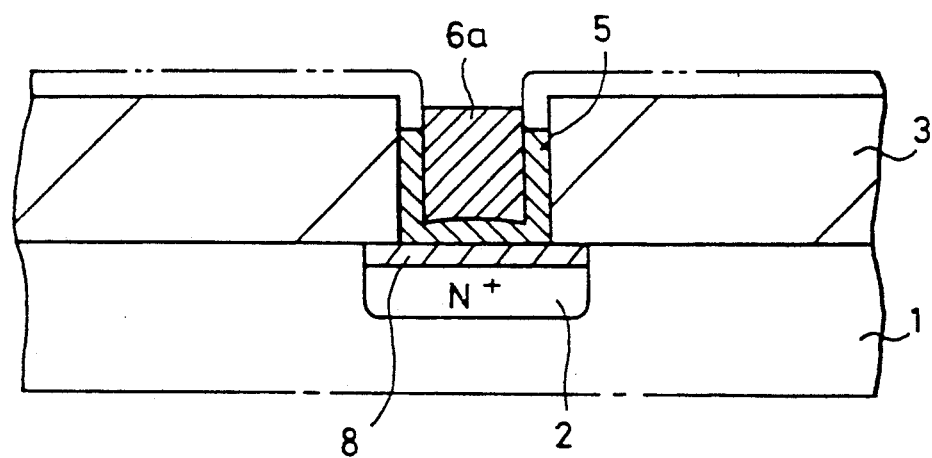
FIG. 2 is a fragmentary cross-sectional view illustrative of a conventional method of making a metal plug.
Figure 3A:
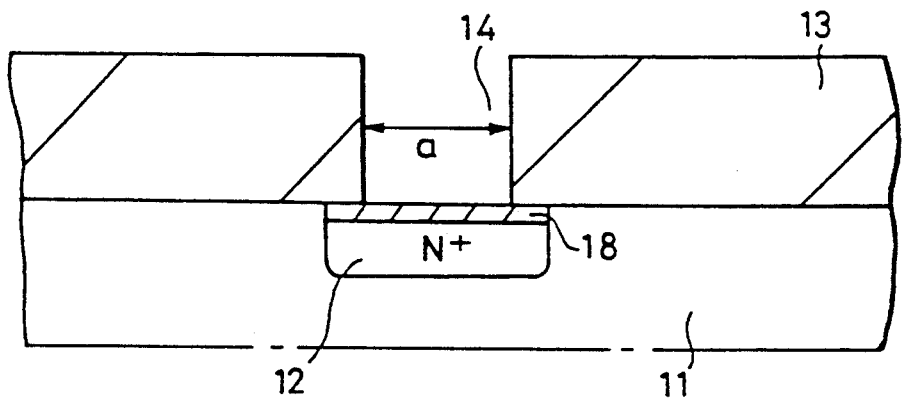

As shown in FIG. 3A, a lower wire 12 is formed as a diffused layer in one surface of a semiconductor substrate 11. A $TiSi_2$ film 18 is deposited as a heat resistant layer on the surface of the diffused lower wire layer 12 by SITOX. Then, an insulating film 13 of $SiO_2$ or the like is deposited on the semiconductor substrate 11 including the $TiSi_2$ film 18, and thereafter the insulating film 13 is selectively etched through a resist mask (not shown), forming a connection hole 14 extending down to the lower wire 13.

Figure 3B:
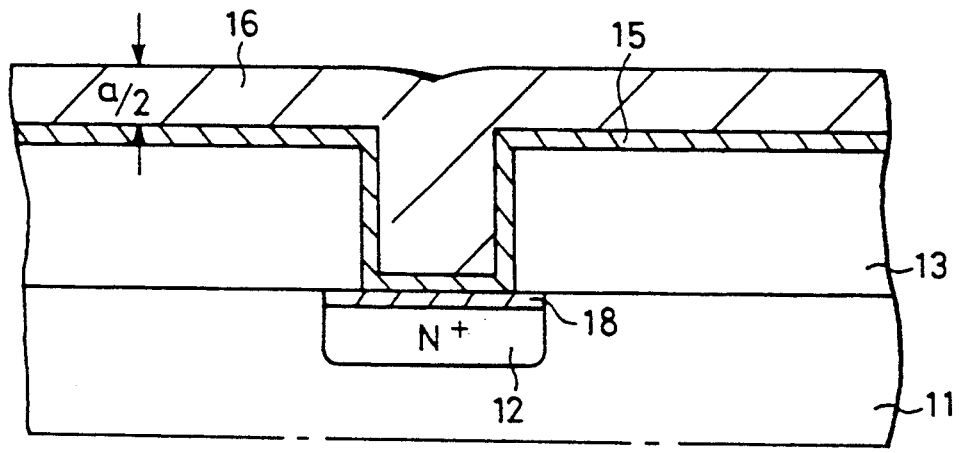

Then, as shown in FIG. 3B, an adhesion layer 15 such as a TiN film is deposited on the insulating film 13 and in the connection hole 14 by sputtering, for example. The adhesion layer 15, e.g., a TiN film, may be deposited in a reactive sputtering process employing a normal Ti target and an $N_2$ gas. Thereafter, a layer of a refractory metal, such as a blanket tungsten layer 16, is deposited on the adhesion layer 15 so as to fill the connection hole 14 by CVD. The blanket tungsten layer 16 may be deposited with a gas of $WF_6$ and $H_2$, supplied at a ratio of 1:6, respectively, under a pressure of 10640 Pa at a temperature of 475° C. The blanket tungsten layer 16 should be as thin as possible. It is desirable that the thickness of the blanket tungsten layer 16 be a/2 where a represents the width of the connection hole 14.

Figure 3C:
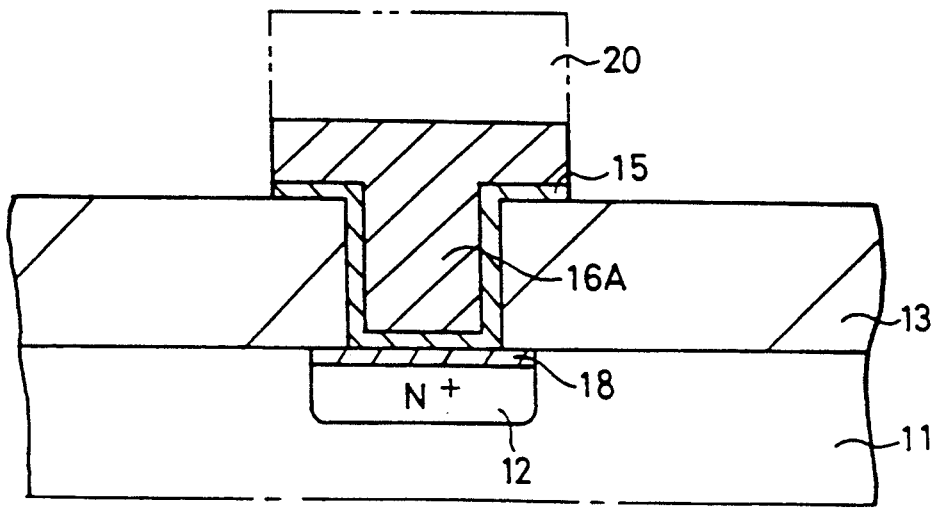

Then, as shown in FIG. 3C, a resist mask 20 is deposited on the blanket tungsten layer 16, the resist mask 20 having a width larger than that of the connection hole 14. Using the resist mask 20, the blanket tungsten layer 16 and the adhesion layer 15 are selectively etched away, leaving a portion of the blanket tungsten layer 16 as a metal plug 16A in the connection hole 14. The blanket tungsten layer 16 and the adhesion layer 15 may be etched away with a gas of 30 SCCM of $SF_6$ and 20 SCCM of $H_2$ under a pressure of 2 Pa with a power of 0.23 $W/cm^2$. After the etching process, the resist mask 20 is removed by ashing.

Subsequently, as shown in FIG. 3D, a metal layer 21 which will serve as an upper wire is deposited on the entire surface formed so far. For example, an Al-Si film is sputtered as the metal layer 21 on the entire surface under normal sputtering conditions.

After the surface of the metal layer 21 is smoothed by a resist film (not shown), as illustrated in FIG. 3E, the metal layer 21 is etched back until its upper surface lies flush with the upper surface of the metal plug 16A, thus forming an upper wire 21A of Al-Si film, for example. The metal layer 21 may be etched back with a $BCl_3/Cl_2$ gas to which an $O_2$ gas is added, such that the ratio of the etching rates of the resist film and Al is 1:1.

In the above embodiment, when the blanket tungsten layer 16 and the adhesion layer 15 are selectively etched away, forming the metal plug 16A, the metal plug 16A has an upper portion left on the insulating film 13 in a size greater than the width of the connection hole 14. Therefore, the adhesion layer 15 at least within the connection hole 14 is prevented from being overetched, with the result that the metal plug 16A thus formed is of a good configuration. The upper wire 21A has a flat upper surface because the metal layer 21 such as an Al-Si film, after having been sputtered, is etched back until its upper surface lies flush with the upper surface of the metal plug 16A.

When the Al-Si film is sputtered to form the upper wire, wedge-shaped grooves tend to be formed as shown in FIG. 3E because the sputtered Al has a poor step coverage. To avoid such a drawback, an Al film may be deposited as an upper wire by CVD or a high-temperature device sputtering process, or a tungsten film may be deposited as an upper wire by blanket tungsten CVD.

FIGS. 4A through 4D show a method of making a metal plug according to another embodiment of the present invention.

Figure 4A:
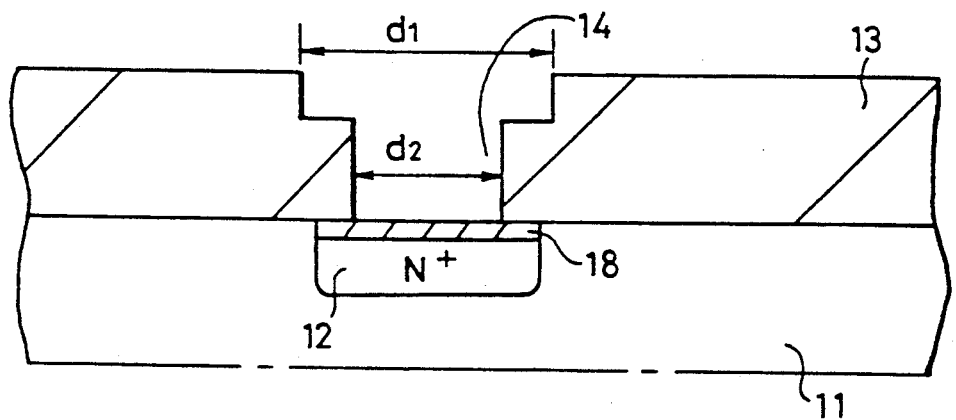
FIGS. 4A, 4B, 4C, and 4D are fragmentary cross-sectional views illustrative of a method of making a metal plug according to another embodiment of the present invention.

As shown in FIG. 4A, after an insulating film 13 of $SiO_2$ or the like is deposited on a semiconductor substrate 11 having a diffused lower wire 12 and a TiSi$_2$ film 18, the insulating film 13 is processed by two successive lithographic processes, forming a stepped connection hole 14 therein. The stepped connection hole 14 has an upper portion having a width d$_1$ and a lower portion having a width d$_2$, the width d1 being larger than the width d$_2$.

Figure 4B:
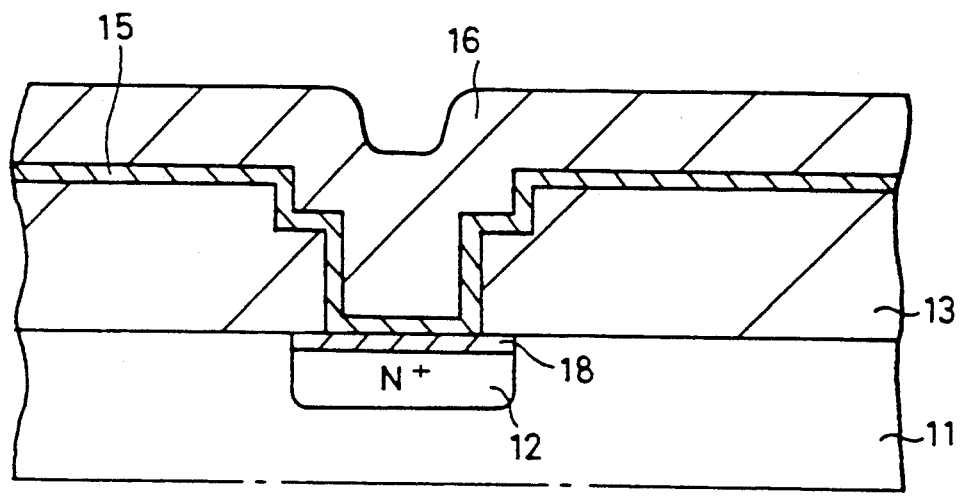

Then, as shown in FIG. 4B, an adhesion layer 15 such as a TiN film is deposited on the insulating film 13 and in the connection hole 14. A blanket tungsten layer 16 is thereafter deposited on the adhesion layer 15 so as to fill the connection hole 14 by CVD.

Figure 4C:
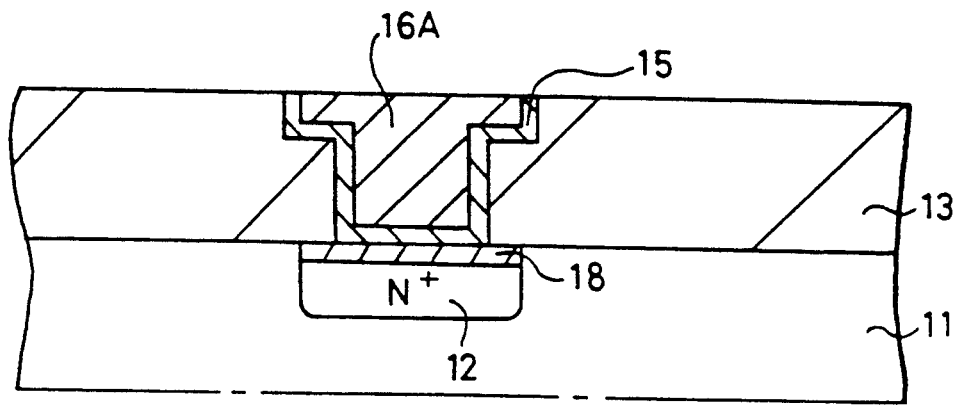

As shown in FIG. 4C, the blanket tungsten layer 16 and the adhesion layer 15 are etched back and removed from the upper surface of the insulating layer 13, leaving a portion of the blanket tungsten layer 16 as a metal plug 16A in the connection hole 14. Even if the adhesion layer 15 is somewhat overetched in the connection hole 14 when the blanket tungsten layer 16 and the adhesion layer 15 are etched back, since the connection hole 14 is of a stepped shape, the overetching of the adhesion layer 15 is stopped in the upper wider portion of the connection hole 14, but does not extend into the lower narrower portion of the connection hole 14. Therefore, the metal plug 16A thus formed is of a good configuration.

The selection ratio of the TiN film, for example, as the adhesion layer 15 and the SiO$_2$ film, for example, as the insulating film 13 is selected to be large.

Figure 4D:
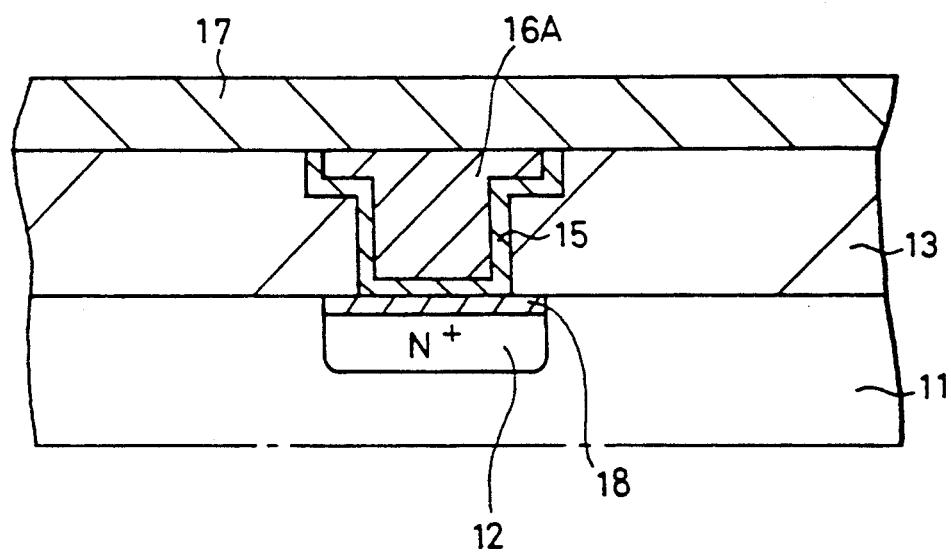

Then, as shown in FIG. 4D, an upper wire 17 which may comprise a metal layer of Al is deposited on the insulating film 13 so as to be connected to the metal plug 16A.

In this embodiment, the connection hole 14 has a stepped shape including the upper portion wider than the lower portion thereof, and the blanket tungsten layer 16 is embedded in the stepped connection hole 14. Even if the blanket tungsten layer 16 and the adhesion layer 15 are overetched when they are subsequently etched back, therefore, the overetching does not extend downwardly beyond the upper wider portion of the connection hole 14. The metal plug 16A thus formed is highly reliable, and does not adversely affect the step coverage of the subsequently formed upper wire 17, with resultant good multilayer wires.

FIGS. 5A through 5E show a method of making a metal plug according to still another embodiment of the present invention. The method according to the embodiment shown in FIGS. 5A through 5E also employs a stepped connection hole.

Figure 5A:
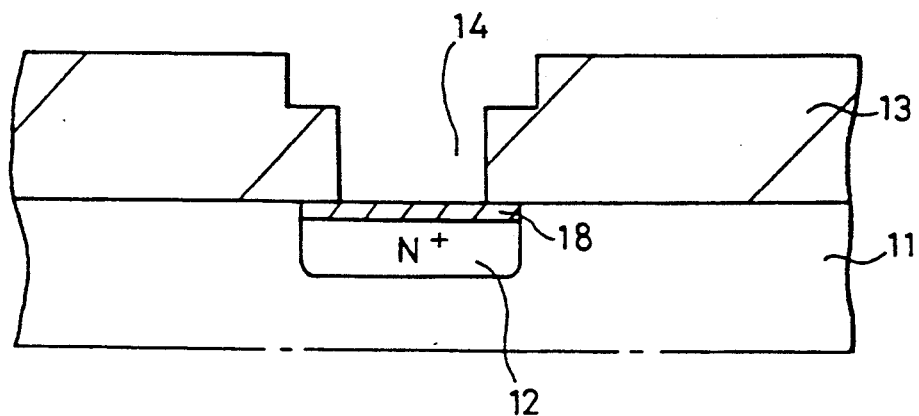
FIGS. 5A, 5B, 5C, 5D, and 5E are fragmentary cross-sectional views illustrative of a method of making a metal plug according to still another embodiment of the present invention.

As shown in FIG. 5A, after an insulting film 13 of SiO$_2$ or the like is deposited on a semiconductor substrate 11 having a diffused lower wire 12 and a TiSi$_2$ film 18, the insulating film 13 is processed by two successive lithographic processes, forming a stepped connection hole 14 therein. The stepped connection hole 14 has an upper portion and a lower portion, the upper portion being wider than the lower portion.

Figure 5B:
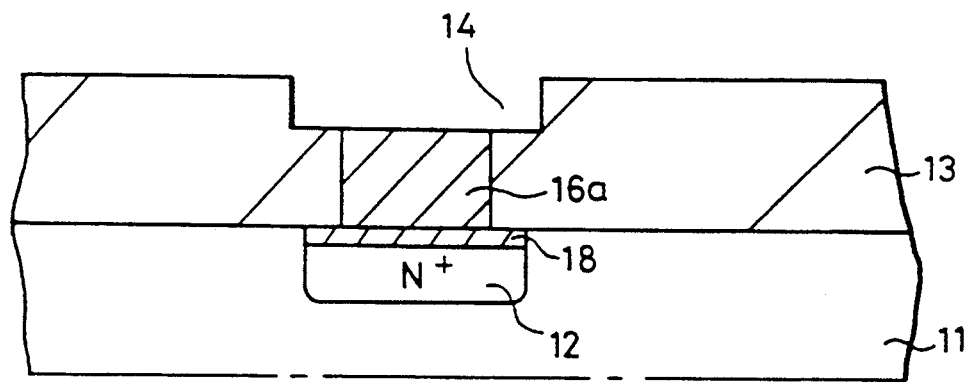

Then, as shown in FIG. 5B, a first tungsten layer 16a is deposited in the lower portion of the connection hole 14 by selective tungsten CVD. The first tungsten layer 16a may be deposited by selective tungsten CVD with a gas of 10 SCCM of WF$_6$, 7 SCCM of SiH$_4$, and 1000 SCCM of H$_2$ under a pressure of 26.6 Pa at a temperature of 260° C.

Figure 5C:
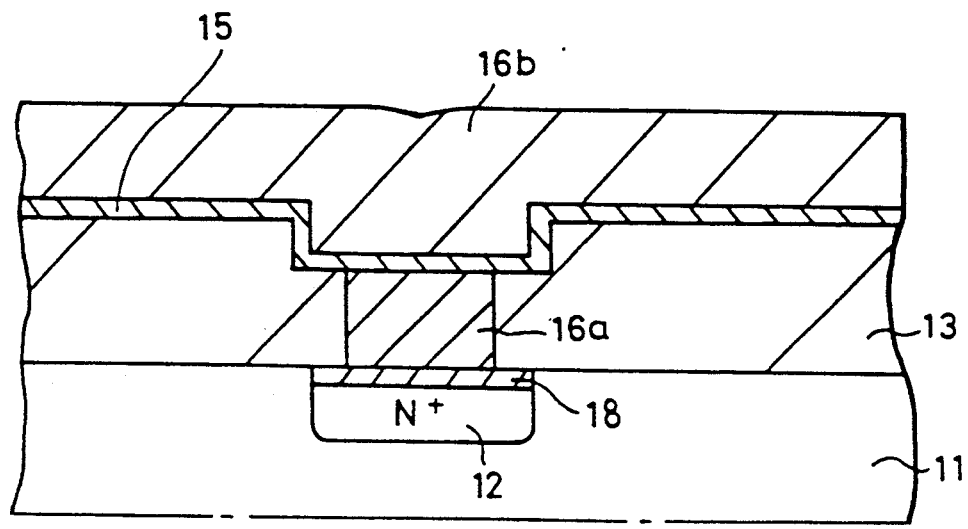

Then, as shown in FIG. 5C, an adhesion layer 15 such as a TiN film is deposited on the insulating film 13 and in the upper portion of the connection hole 14, to a thickness of 30 nm by sputtering. A second tungsten layer, i.e., a blanket tungsten layer 16b, is thereafter deposited on the adhesion layer 15 so as to fill the upper portion of the connection hole 14. The blanket tungsten layer 16b may be deposited with a gas of 60 SCCM of WF$_6$ and 360 SCCM of H$_2$ under a pressure of 10640 Pa at a temperature of 475° C.

Figure 5D:
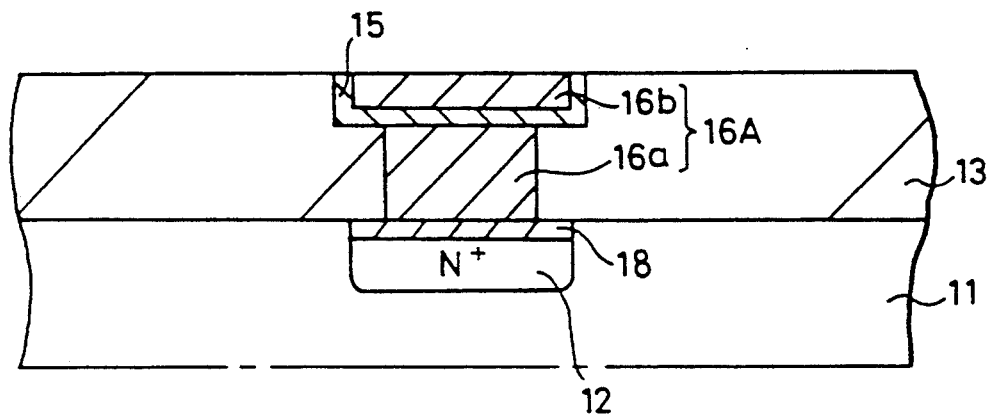
Figure 5E:
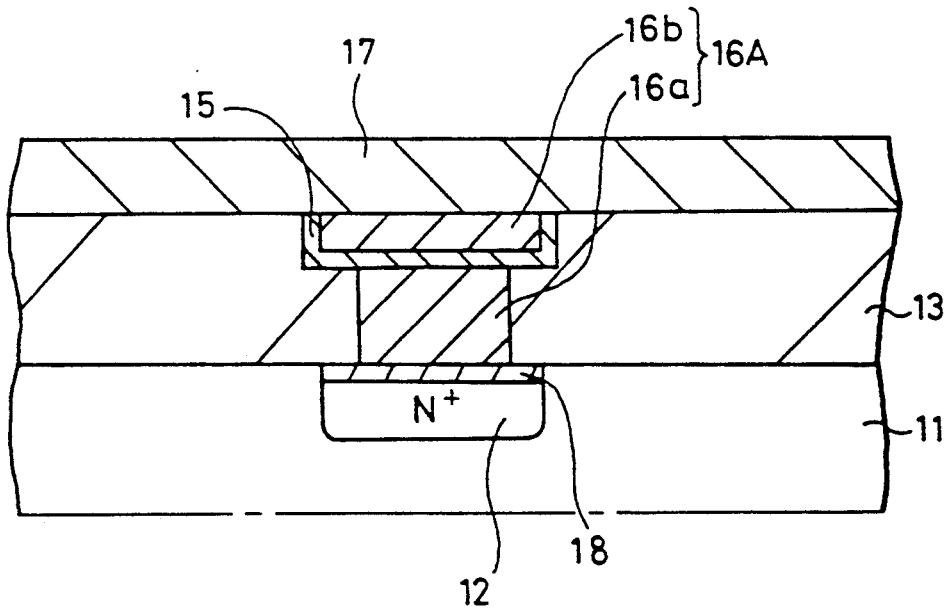

As shown in FIG. 5D, the blanket tungsten layer 16b and the adhesion layer 15 are etched back and removed from the upper surface of the insulating layer 13, leaving a portion of the second tungsten layer 16b in the upper portion of the connection hole 14. The blanket tungsten layer 16b and the adhesion layer 15 may be etched back with a gas of 30 SCCM of SF$_6$ and 20 SCCM of Cl$_2$ under a pressure of 2.0 Pa with a power of 0.25 W/cm$^2$. As a result, the first tungsten layer 16a and the second tungsten layer 16b in the respective upper and lower portions of the connection hole 14 jointly serve as a metal plug 16A.

Figure 6A:
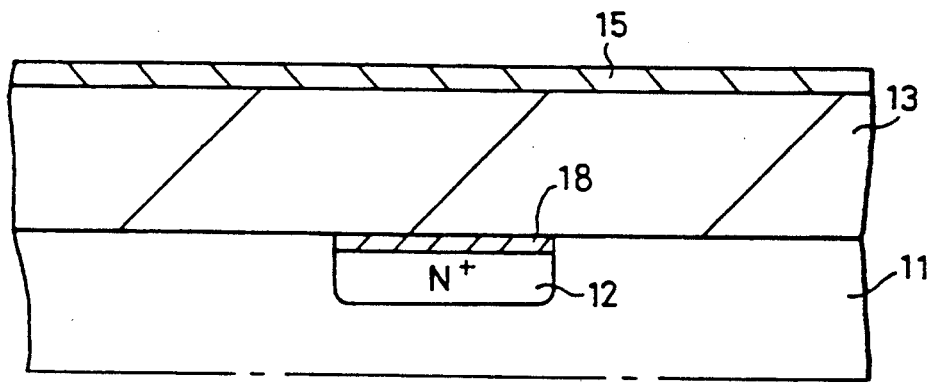
FIGS. 6A, 6B, 6C, 6D, 6E, 6F, and 6G are fragmentary cross-sectional views illustrative of a method of making a metal plug according to yet still another embodiment of the present invention.
Figure 6B:
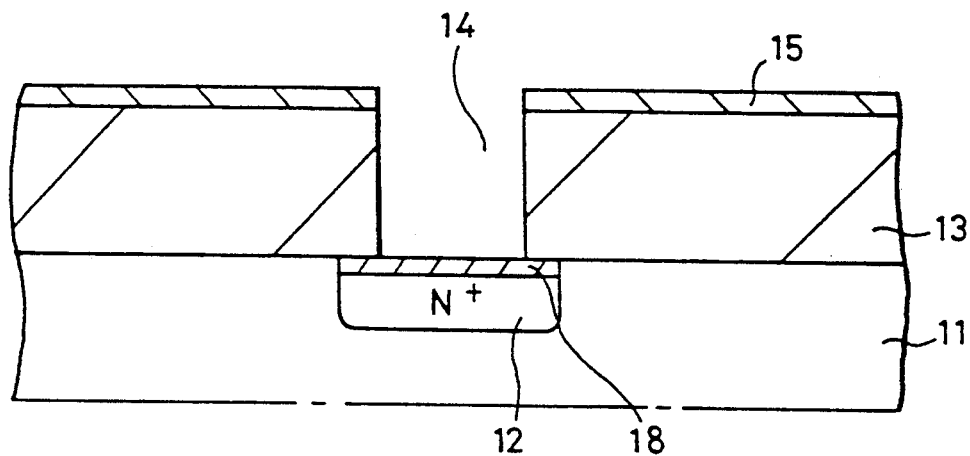
Figure 6C:
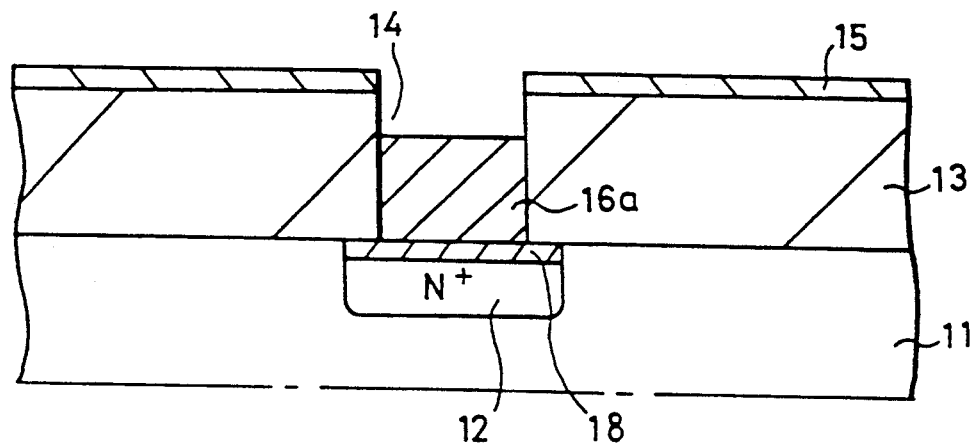
Figure 6D:
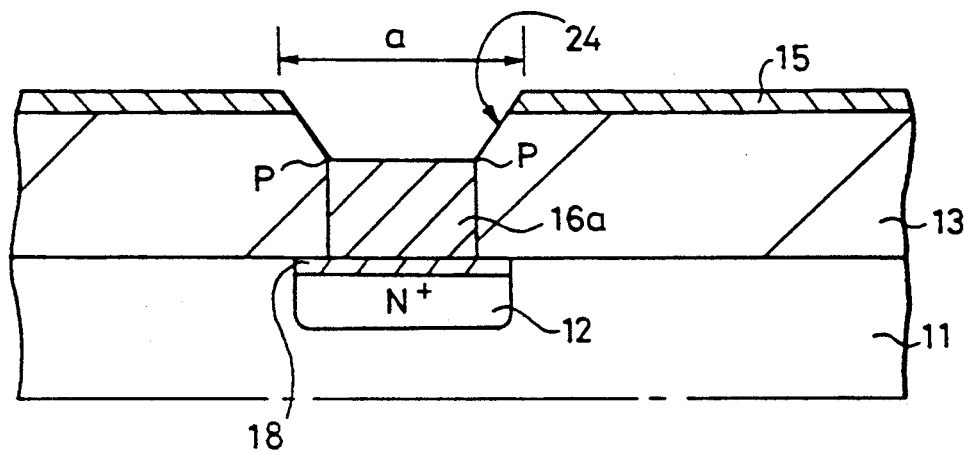
Figure 6E:
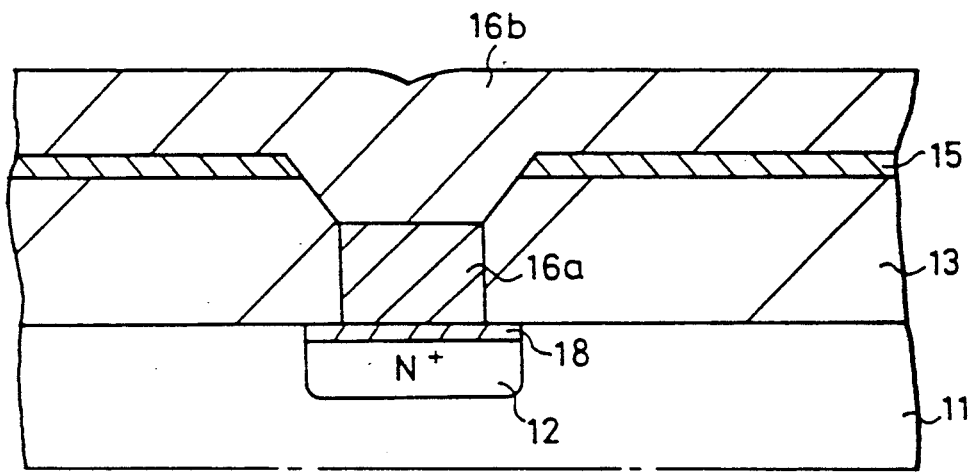

Thereafter, as shown in FIG. 6E, an upper wire 17 is deposited on the insulating film 13 so as to be connected to the metal plug 16A.

In this embodiment, inasmuch as the lower portion of the connection hole 14 is filled with the first tungsten layer 16a by selective tungsten CVD, the problem of step coverage of the adhesion layer 15 and the blanket tungsten layer 16b can be avoided. Even if the adhesion layer 15 is somewhat overetched in the connection hole 14 when the blanket tungsten layer 16b and the adhesion layer 15 are etched back, the overetching of the adhesion layer 15 is stopped in the upper wider portion of the connection hole 14, but does not extend into the lower narrower portion of the connection hole 14. Therefore, the upper wire 17 can subsequently be formed with a good step coverage.

FIGS. 6A through 6G show a method of making a metal plug according to yet still another embodiment of the present invention.

As shown in FIG. 6A, an insulting film 13 of SiO$_2$ or the like is deposited on a semiconductor substrate 11 having a diffused lower wire 12 and a TiSi$_2$ film 18, and then an adhesion layer 15 such as a TiN film is deposited on the insulating film 13.

Then, as shown in FIG. 6B, the adhesion layer 15 and the insulating layer 13 are selectively etched by dry etching through a resist mask (not shown) under normal conditions, forming a connection hole 14 therein.

As shown in FIG. 6C, a tungsten layer 16a is deposited in the connection hole 14 up to a certain depth by selective tungsten CVD. The tungsten layer 16a may be deposited by selective tungsten CVD with a gas of 10 SCCM of WF$_6$, 7 SCCM of SiH$_4$, and 1000 SCCM of H$_2$ under a pressure of 26.6 Pa at a temperature of 260° C.

Then, as shown in FIG. 6D, only the shoulder of the connection hole 14 is removed along a tapered surface by horizontal lateral etching according to a bias ECRCVD process, for example.

The tapered upper opening of the connection hole should preferably have a width a equal to the width of an upper wire and an alignment tolerance.

The horizontal lateral etching is carried according to the bias ECRCVD process under such conditions that the etching and deposition rates are equal to each other, i.e., the combined etching rate is 0, with respect to a flat surface (horizontal surface), and the etching rate is larger than the deposition rate, i.e., the combined etching rate is larger than 0, with respect to a slant surface.

The horizontal lateral etching is so called because it can etch an inclined surface back in a horizontal direction without etching a flat surface. With the horizontal lateral etching, the surrounding region of the insulating film 13 and the adhesion layer 15 which extends around the connection hole 14 above the tungsten layer 16a is etched away along a tapered surface 24 that is gradually inclined away from vertical planes at points p on the upper end of the tungsten layer 16a.

Then, as shown in FIG. 6E, a blanket tungsten layer 16b is deposited on the adhesion layer 15 and in the tapered opening of the connection hole 14a. The blanket tungsten layer 16b may be deposited with a gas of 60 SCCM of $WF_6$ and 360 SCCM of $H_2$ under a pressure of 10640 Pa at a temperature of 475° C.

Figure 6F:
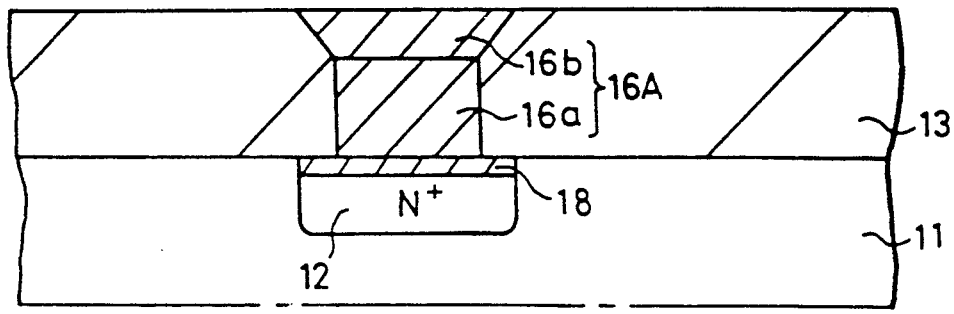

As shown in FIG. 6F, the blanket tungsten layer 16b is thereafter etched back. The blanket tungsten layer 16b may be etched back with a gas of 30 SCCM of $SF_6$ and 20 SCCM of $Cl_2$ under a pressure of 2.0 Pa with a power of 0.25 $W/cm^2$. Then, the adhesion layer 15 is etched away. As a result, the first tungsten layer 16a and the second tungsten layer 16b which is left as a metal plug 16A in the connection hole 14.

Figure 6G:
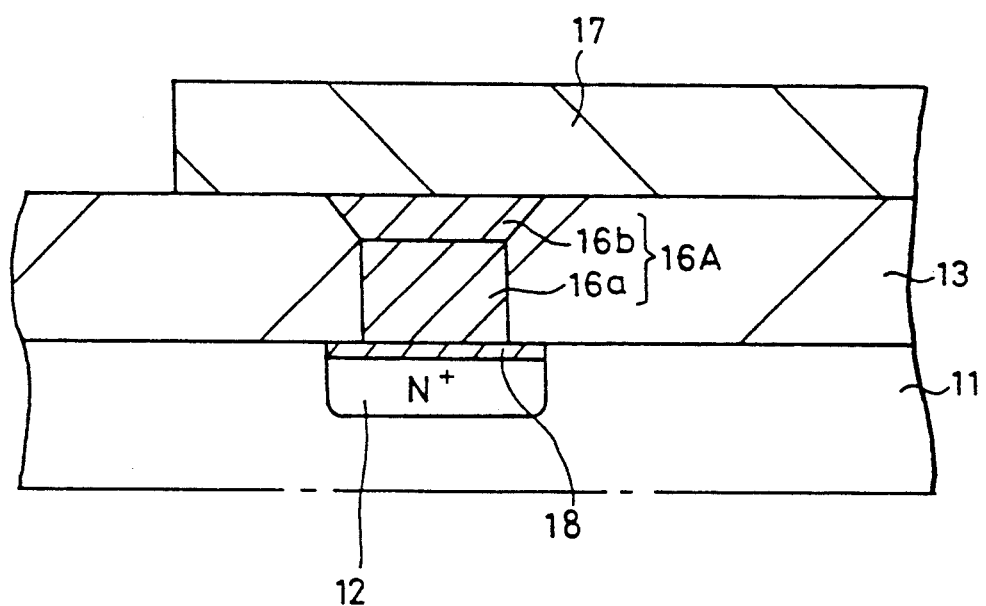

Thereafter, as shown in FIG. 6G, an upper wire 17 is deposited on the insulating film 13 so as to be connected to the metal plug 16A.

In this embodiment, inasmuch as the lower portion, which is of a minimum dimension, of the connection hole 14 is filled with the first tungsten layer 16a by selective tungsten CVD, the problem of step coverage of the adhesion layer 15 and the blanket tungsten layer 16b can be avoided. Since no adhesion layer is provided in the connection hole 14, no overetching of any adhesion layer occurs in the connection hole 14. The metal plug 16A thus formed is highly reliable, and so are multilayer wires that are formed in electric connection with the metal plug 16A.

After the step shown in FIG. 6B, the adhesion layer 15 may be etched away by side etching over a distance equal to the width a shown in FIG. 6D, and then the insulating film 13 may thereafter be etched by horizontal lateral etching. This alternative process is effective to increase the throughput upon horizontal lateral etching.

While the lower wire 12 is formed as a diffused layer in each of the above embodiments, the present invention is equally applicable to lower wires of other configurations.

The methods according to the present invention are effective to make metal plugs in via holes and contact holes.

Having described preferred embodiments of the invention with reference to the accompanying drawings, it is to be understood that the invention is not limited to that precise embodiments and that various changes and modifications could be effected by one skilled in the art without departing from the spirit or scope of the invention as defined in the appended claims.

What is claimed is:

1. A method of making a metal plug in a connection hole in an insulating film, comprising the steps of:
    forming a connection hole in an insulating film;
    depositing an adhesion layer on said insulating film and in said connection hole;
    depositing a first metal layer on said adhesion layer;
    etching away said first metal layer and said adhesion layer, leaving a portion of said metal layer as a metal plug in said connection hole, said metal plug including a portion left on said insulating film in a size greater than the width of said connection hole;
    depositing a second metal layer on said first metal layer and on said insulating film; and
    etching away said second metal layer where it overlies said first metal layer, whereby the outer surface of said second metal layer is flush with the outer surface of said first metal layer.

2. A method of making a metal plug in a connection hole in an insulating film, comprising the steps of:
    forming a connection hole in an insulating film;
    depositing a first metal layer up to a predetermined level in said connection hole;
    depositing an adhesion layer on said insulating film and on said first metal layer in said connection hole;
    depositing a second metal layer on said adhesion layer; and
    etching away said second metal layer and said adhesion layer, leaving a portion of said second metal layer and said first metal layer as a metal plug in said connection hole, said plug having an outer surface flush with the surface of said insulating film.

3. A method according to claim 2, wherein said connection hole comprises a stepped connection hole having an upper portion and a lower portion extending up to said predetermined level, said upper portion being wider than said lower portion.

4. A method of making metal plug in a connection hole in an insulating film, comprising the steps of:
    depositing an adhesion layer on an insulating film;
    forming a connection hole in said adhesion layer and said insulating film;
    depositing a first metal layer up to a predetermined level in said connection hole;
    depositing a second metal layer on said adhesion layer and on said first metal layer in said connection hole; and
    etching away said second metal layer and said adhesion layer, leaving a portion of said second metal layer and said first metal layer as a metal plug in said connection hole, said plug having an outer surface flush with the surface of said insulating film.

5. A method according to claim 4, further including the step of:
    enlarging said connection hole along a tapered surface above said predetermined level before said second metal layer is deposited on said adhesion layer and on said first metal layer in said connection hole.

* * * * *